United States Patent
Taguchi

(10) Patent No.: US 8,698,642 B2
(45) Date of Patent: Apr. 15, 2014

(54) ELECTRIC POWER AMOUNT INFORMATION OUTPUT DEVICE AND SYSTEM

(75) Inventor: Shinya Taguchi, Kariya (JP)

(73) Assignee: DENSO CORPORATION, Kariya (JP)

(*) Notice: Subject to any disclaimer, the term of this patent is extended or adjusted under 35 U.S.C. 154(b) by 810 days.

(21) Appl. No.: 12/805,151

(22) Filed: Jul. 15, 2010

(65) Prior Publication Data

US 2011/0032110 A1  Feb. 10, 2011

(30) Foreign Application Priority Data

Aug. 7, 2009 (JP) ................................. 2009-184970

(51) Int. Cl.
*G08B 21/00* (2006.01)

(52) U.S. Cl.
USPC ............... 340/636.1; 340/363.11; 340/691.6; 340/693.2; 340/636.19

(58) Field of Classification Search
USPC ............... 340/636.1, 636.11–636.12, 636.19, 340/664, 691.6, 693.1, 693.2
See application file for complete search history.

(56) References Cited

U.S. PATENT DOCUMENTS

| | | | | |
|---|---|---|---|---|
| 5,441,122 A | * | 8/1995 | Yoshida | 180/65.245 |
| 5,539,399 A | * | 7/1996 | Takahira et al. | 340/995.27 |
| 5,627,752 A | * | 5/1997 | Buck et al. | 701/36 |
| 5,664,635 A | * | 9/1997 | Koga et al. | 180/65.245 |
| 5,790,976 A | * | 8/1998 | Boll et al. | 455/456.5 |
| 5,815,824 A | * | 9/1998 | Saga et al. | 701/22 |
| 5,892,346 A | * | 4/1999 | Moroto et al. | 318/587 |
| 2002/0069000 A1 | * | 6/2002 | Nakao | 701/22 |
| 2009/0240427 A1 | | 9/2009 | Siereveld et al. | |
| 2010/0004853 A1 | | 1/2010 | Siereveld et al. | |

FOREIGN PATENT DOCUMENTS

| | | |
|---|---|---|
| JP | 09-210702 A | 8/1997 |
| JP | A-H10-170293 | 6/1998 |
| JP | A-2001-112121 | 4/2001 |
| JP | A-2002-315193 | 10/2002 |
| JP | 2003-262525 A | 9/2003 |
| JP | 2003262525 * | 9/2003 |
| JP | 2003-294463 A | 10/2003 |
| JP | 2004-151053 A | 5/2004 |
| JP | A-2006-112932 | 4/2006 |
| JP | A-2006-331405 | 12/2006 |
| JP | 2009137456 * | 6/2009 |
| JP | A-2009-137456 | 6/2009 |

OTHER PUBLICATIONS

Office Action mailed Feb. 12, 2013 in corresponding JP Patent Application No. 2009-184970 (and English translation).
Search Report and Written Opinion dated Jul. 10, 2012 in corresponding FR Application No. 1056386 (and English translation).
Office Action mailed Jun. 11, 2013 in corresponding JP patent application No. 2009-184970 (and English translation).

* cited by examiner

*Primary Examiner* — Daniel Previl
(74) *Attorney, Agent, or Firm* — Posz Law Group, PLC

(57) ABSTRACT

In an electric power amount information output device for a vehicle, a control section checks whether a remaining electric power amount of a battery of a motor-driven vehicle at a departure point is less than a total electric power amount required for the vehicle to travel to a destination point. The control section drives an output section to output insufficiency information indicating that the remaining electric power amount of the battery is insufficient, if the remaining electric power amount is less than the required total electric power amount.

16 Claims, 9 Drawing Sheets

FIG. 16

EV NAVIGATION
SEARCH RESULT

| STA-TION | TRAVEL TIME | ARRIVAL TIME | CHARGE START TIME | DESTINATION ARRIVAL TIME |
|---|---|---|---|---|
| A | 5min. | 14:05 | 14:35 | 15:15 |
| B | 15min. | 14:15 | 14:45 | 15:25 |
| C | 25min. | 14:25 | 14:25 | 15:00 |
| D | 20min. | 14:30 | 14:35 | 14:50 |

FIG. 17

EV NAVIGATION
SEARCH RESULT

| STA-TION | TRAVEL TIME | ARRIVAL TIME | CHARGE START TIME | DESTINATION ARRIVAL TIME |
|---|---|---|---|---|
| C | 25min. | 14:25 | 14:25 | 15:00 |
| D | 20min. | 14:30 | 14:35 | 14:50 |
| A | 5min. | 14:05 | 14:35 | 15:15 |
| B | 15min. | 14:15 | 14:45 | 15:25 |

FIG. 18

EV NAVIGATION
SEARCH RESULT

| STA-TION | TRAVEL TIME | ARRIVAL TIME | CHARGE START TIME | DESTINATION ARRIVAL TIME |
|---|---|---|---|---|
| D | 20min. | 14:30 | 14:35 | 14:50 |
| C | 25min. | 14:25 | 14:25 | 15:00 |
| A | 5min. | 14:05 | 14:35 | 15:15 |
| B | 15min. | 14:15 | 14:45 | 15:25 |

ELECTRIC POWER AMOUNT INFORMATION OUTPUT DEVICE AND SYSTEM

CROSS REFERENCE TO RELATED APPLICATION

This application is based on and incorporates herein by reference Japanese Patent Application No. 2009-184970 filed on Aug. 7, 2009.

FIELD OF THE INVENTION

The present invention relates to a system and a device for outputting information about remaining electric power of a battery equipped for an electric motor, which is provided as a drive power source of a vehicle.

BACKGROUND OF THE INVENTION

A motor-driven vehicle such as an electric vehicle (EV) or a plug-in hybrid vehicle (PHV) uses an electric motor as a drive power source for vehicle travel. In the vehicle, it is necessary to charge a battery, which supplies the motor with electric power, when the amount of electric power remaining in the battery (stored electric charge of the battery) falls. It is therefore proposed to assist a driver of the vehicle so that the battery may be charged before the battery runs down and the vehicle becomes inoperative.

For example, the following patent document 1 discloses a technology, which calculates a travelable distance (further travel distance) when a remaining electric power amount of a battery falls below a predetermined level. The technology further provides a driver with position information about an electric energy supply station (charging station) located near a present position of the vehicle as well as discrimination information about possibility of arriving at the charging station. The travelable distance of the vehicle is calculated based on the remaining electric power amount of the battery.

Further, the following patent document 2 discloses another technology, which selects a charging station located near a present position of a vehicle out of a plurality of pre-stored charging stations and provides a driver of the vehicle the location of the selected charging station as well as availability of an electric battery charger installed in the selected charging station. Patent document 2 further discloses a technology, which checks at a predetermined time interval whether it is possible to continue to travel to the destination without charging the battery. This checking may be made based on the remaining electric power amount of the battery of the vehicle and an amount of electric power required for the vehicle to travel from the present position to the destination. According to this technology, if it is determined that it is not possible to reach the destination with only the remaining electric power of the battery, the charging of the battery can be started immediately or within a predetermined time after arriving at the charging station and information about the charger device, which can charge the battery to the required capacity.

Patent document 1: JP 9-210702A
Patent document 2: JP 2003-262525A

For traveling from a departure point to a destination point without being constrained too much in time, it is essential to plan a travel schedule, which determines the time of departure based on the scheduled time of arrival at the destination point so that the driver need not be so hasty in driving the vehicle. It is also essential that the driver need not worry about so much whether the user can reach the destination point with the remaining electric power amount of the battery, which varies from time to time.

In this regard, the technology of patent document 1 provides only information about charging stations, which are located near the vehicle when the remaining electric power amount falls below the predetermined level. It is not clear whether the vehicle can reach the destination with only the remaining electric power amount of the battery available at present. Thus, the technology of patent document 1 cannot provide the driver with sufficient reassurance. The technology of patent document 1 does not provide the driver with information whether the driver can reach the destination with only the presently available remaining capacity. The driver thus cannot take into consideration the necessity of charging the battery or the charging time of the battery, and hence cannot plan the travel schedule with sufficient time allowance.

According to the technology of patent document 2, although it is possible to check whether the vehicle can reach the destination with only the remaining electric power amount of the battery, it is not possible to plan a travel schedule at the time of departure of the vehicle in consideration of the remaining electric power amount of the battery. The driver thus cannot plan the travel schedule with sufficient time allowance, according to the technology of patent document 2.

SUMMARY OF THE INVENTION

It is therefore an object of the present invention to provide a system and a device for outputting information about electric charge capacity, which enables a user to plan a travel schedule of a motor-driven vehicle with sufficient time allowance.

According to the present invention, an electric power amount information output device is provided for outputting information indicating a remaining electric power amount of a battery provided as a drive power source to electrically drive a vehicle. The electric power amount information output device comprises a departure point information acquisition section, a destination point information acquisition section, a remaining electric power amount calculation section, a required total electric power amount calculation section, an output section and a control section. The departure point information acquisition section acquires departure point information indicating a point of departure of the vehicle. The destination point information acquisition section acquires destination point information indicating a point of destination of the vehicle. The remaining electric power amount information acquisition section acquires remaining electric power amount information indicating an amount of electric power remaining in the battery. The required total electric power amount calculation section calculates a required total electric power amount based on the departure point information and the destination point information. The required total electric power amount indicates an amount of electric power required for the vehicle to travel from the departure point to the destination point. The output section outputs information. The control section checks whether the remaining electric power amount indicated by the remaining electric power amount information at the departure point is less than the required total electric power amount. The control section further drives the output section to output insufficiency information indicating that the remaining electric power amount of the battery is insufficient if the remaining electric power amount is less than the required total electric power amount.

BRIEF DESCRIPTION OF THE DRAWINGS

The above and other objects, features and advantages of the present invention will become more apparent from the following detailed description made with reference to the accompanying drawings. In the drawings:

FIG. 16 is a diagram schematically showing an example of display by an output device shown in FIG. 5;

FIG. 17 is a diagram schematically showing an example of display by an output device shown in FIG. 5;

FIG. 18 is a diagram schematically showing an example of display by an output device shown in FIG. 5;

DETAILED DESCRIPTION OF THE PREFERRED EMBODIMENT (First Embodiment)

Figure 1:
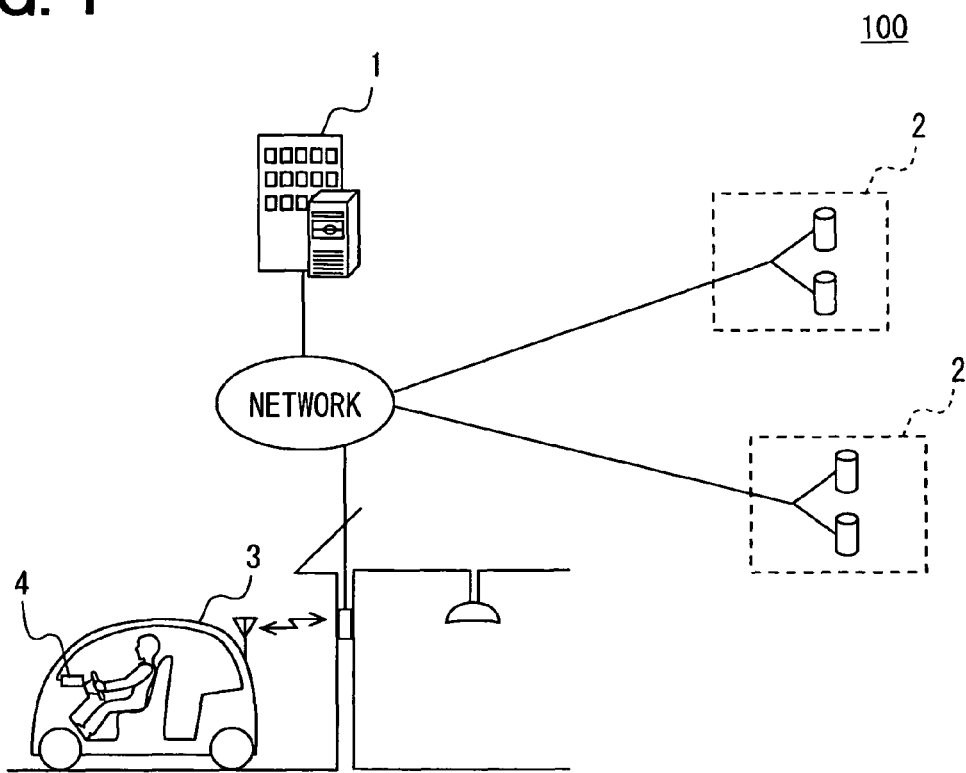
FIG. 1 is a block diagram schematically showing an electric storage information output system according to the first embodiment of the present invention.

Referring to FIG. 1, an electric power amount information output system 100 includes a charging management center 1, a plurality of charging stations 2, a motor-driven vehicle 3 and an electric power amount information output device 4. The charging management center 1, the charging stations 2 and the electric power amount information output device 4 are connected one another through a communications network such as the Internet network to be capable of transmitting and receiving information.

Figure 2:
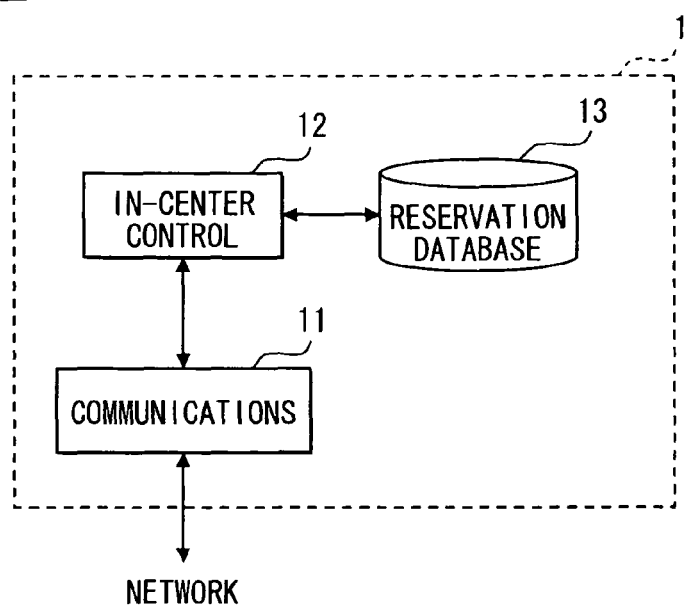
FIG. 2 is a block diagram schematically showing a charging management station in the first embodiment.

The charging management center 1 is provided to manage reservations for using the charging stations 2. The charging management center 1 is configured, as schematically shown in FIG. 2, to include an in-center communications unit 11, an in-station control unit 22 and a charging reservation database (DB) 13.

The in-center communications unit 11 is configured to transmit and receive information to and from the charging stations 2 and the output device 4 through the communications network such as the Internet network. For example, when a request signal, which requests transmission of information (availability information) indicating whether a charger device 23 of the charging station 2 (FIG. 3) is transmitted from the output device 4, the in-center communications unit 11 transmits the availability information to the in-center control unit 12 upon reception of the request signal. The in-center communications unit 11 further transmits in return the availability information transmitted from the in-center control unit 12 in response to the request signal toward the output device 4. When a request signal for a temporary reservation or a formal reservation is transmitted from the output device 4, the in-center communications unit 11 transmits the request signal to the in-center control unit 12 upon reception of the request signal. The in-center communications unit 11 further transmits in return a command signal for a temporary reservation or a formal reservation transmitted from the in-center control unit 12 in response to the request signal toward the charging stations 2.

The availability information may be at least one of information indicating presence or absence of reservation for the charger device 23, that is, availability of the charger device 23, or indicating a reserved time period of the charger device 23, that is, available time period of the charger device 23. It is assumed hereunder that the availability information includes at least the information indicating the time zone, in which the charger device 23 is available.

The communications (transmission and reception of information) between the charging management center 1 and the output device 4 may be performed by the Internet network provided inside building structures such as houses and facilities. More specifically, the information may be communicated between the output device 4 and the building structures by way of short distance radio communications, which includes radio LAN, ZigBee (trademark), Bluetooth (trademark) or the like. The information may be communicated between the building structures and the charging management center 1 by way of the Internet network (broadband network) provided inside the building structures.

The information may also be communicated between the charging management center 1 and the output device 4 by way of a cellular phone network by using an in-vehicle communications module such as a data communications module (DCM), which is used in Telematics communications, without using the Internet network in the building structures.

The in-center control unit 12 is configured with a microcomputer, which includes a CPU, a ROM, a RAM, a backup RAM, an I/O and the like, although not shown in the figures. The CPU performs various processing by executing various control programs stored in the ROM.

For example, when the request signal for the transmission of the availability information is transmitted from the in-center communications unit 11, the in-center control unit 12 acquires the availability information stored in the charging reservation database 13 and transmits it to the in-center communications unit 11.

When the request signal for the temporary reservation is transmitted from the in-center communications unit 11, the in-center control unit 12 drives the in-center communications unit 11 to transmit the command signal for the temporary reservation toward the charging station 2 in response to the request signal for the temporary reservation. This command signal for the temporary reservation limits the use of the charger device 23 of the charging station 2 to only a temporary use (for example, a predetermined time period of a few minutes) by a specified user. When the request signal for the formal reservation is transmitted from the in-center communications unit 11, the in-center control unit 12 drives the in-center communications unit 11 to transmit the command signal for the formal reservation toward the charging station 2 in response to the request signal for the formal reservation. This command signal for the formal reservation limits the use of the charger device 23 of the charging station 2 to only a use by a specified user for a time period, which is requested by the request signal. The specified user may be a user of the vehicle 3, which may for example be identified by the vehicle ID. When the command signal for the temporary reservation or the command signal for the formal reservation is transmitted from the in-center communications unit 11, the in-center control unit 12 updates the availability information stored in the charging reservation database 13.

In the charging reservation database 13, each availability information includes identification code to indicate to which one of charger devices 23 of which one of the charging stations 2 the availability information belongs.

The charging stations 2 are located at a plurality of outdoor places for charging the battery of the vehicle 3. Although two charging stations 2 are shown in FIG. 1, more number of charging stations may be provided in the electric power amount information output system 100.

Figure 3:
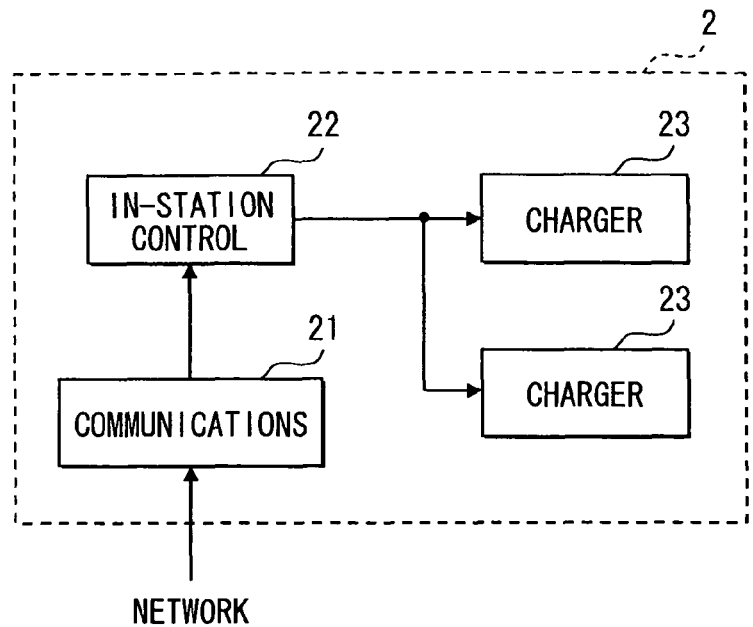
FIG. 3 is a block diagram schematically showing a charging station in the first embodiment.

The charging station 2 is configured, as schematically shown in FIG. 3, to include an in-station communications unit 21, an in-station control unit 22 and a plurality of charger devices 23.

The in-station communications unit 21 is configured to transmit and receive information to and from the charging management center 1 through the communications network such as the Internet network. Specifically, when the command signal for the temporary reservation is received from the charging management center 1, the in-station communications unit 21 transmits the command signal for the temporary reservation to the in-station control unit 22. When the command signal for the formal reservation is received from the charging management center 1, the in-station communications unit 21 transmits this command signal for the formal reservation to the in-station control unit 22.

The in-station control unit 22 is configured with a microcomputer, which includes a CPU, a ROM, a RAM, a backup RAM, an I/O and the like, although not shown in the figures. The CPU performs various processing by executing various control programs stored in the ROM. When the command signal for the temporary reservation is transmitted from the in-station communications unit 21, the in-station control unit 22 limits the use of the charger device 23 of the charging station 2 to only a temporary use (for example, a few minutes) by a specified user in correspondence to the command signal for the temporary reservation. When the command signal for the formal reservation is transmitted from the in-station communications unit 21, the in-station control unit 22 limits the use of the charger device 23 of the charging station 2 to only a use by a specified user for a time period. This charger device 23 and the time zone are identified by the command signal for the formal reservation.

The reservation may be effective until it is cancelled, the charger device 23 is actually used by the specified user or the reserved time elapses. The user may be checked whether the user is authorized to use the charger device 23 as the specified user by acquiring the vehicle ID from the vehicle 3 through the radio communications or the power cable communications and comparing the acquired vehicle ID with a vehicle ID specifically assigned to a specified user, who is authorized to use the charger device 23.

The charger device 23 is configured to charge a travel-purpose battery 32 of the vehicle 3 (FIG. 4) with electric power. The charger device 23, which is provided to charge the battery 32 of the vehicle 3 with the electric power, may be the same as a conventional charger device for charging a battery of a motor-driven vehicle. The electric power may be charged from the charger device 23 to the battery 32 by way of plug contact or non-contact electromagnetic induction.

Although the charging station 2 is shown in FIG. 3 as having two charger devices 23, it may have only one charger device 23 or more than two charger devices 23.

Figure 4:
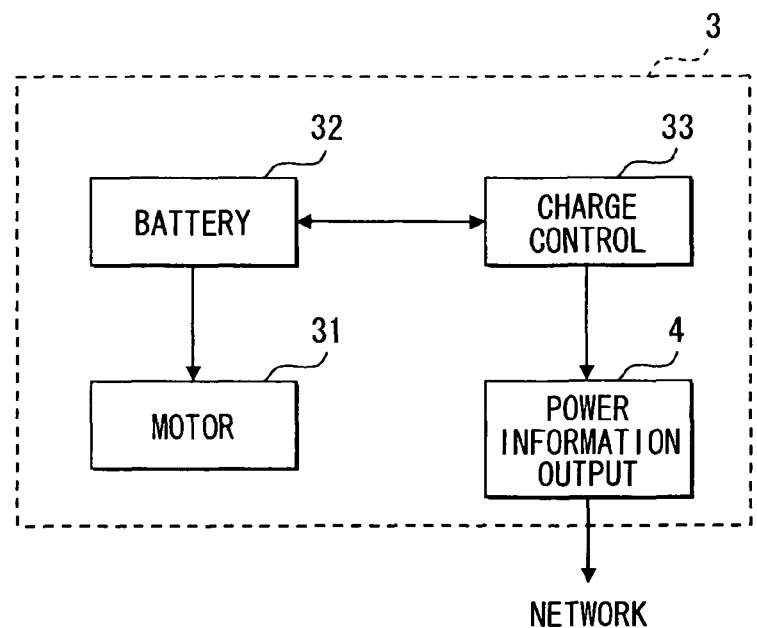
FIG. 4 is a block diagram schematically showing an electric vehicle in the first embodiment.

The vehicle 3 may be either an electric vehicle (EV), which uses only an electric motor 31 as a drive power source for vehicle travel, or a plug-in hybrid vehicle (PHV), which uses both of the motor 31 and an engine as the drive power source for vehicle travel. As shown in FIG. 4, the vehicle 3 is configured to include, in addition to the motor 31 and the battery 32, a charge control unit 33 and an electric power amount information output device 4.

The motor 31 is an apparatus, which converts electric energy (electric power) supplied from an external side into rotation energy (drive power) and is used as the drive power source of the vehicle 3. The battery 32 is provided for supplying the electric power to the motor 31, which is used as the drive power source of the vehicle.

The charge control unit 33 is configured with a microcomputer, which includes a CPU, a ROM, a RAM, a backup RAM, an I/O and the like, although not shown in the figures. The CPU performs various processing by executing various control programs stored in the ROM. For example, the charge control unit 33 executes various conventional processing related to charging from the charging station 2 to the battery 32. The charge control unit 33 is configured to monitor a state of charge (SOC) of the battery 32 and acquires information about the remaining electric charge amount (remaining electric power amount) of the battery 32.

Figures 5, 6:
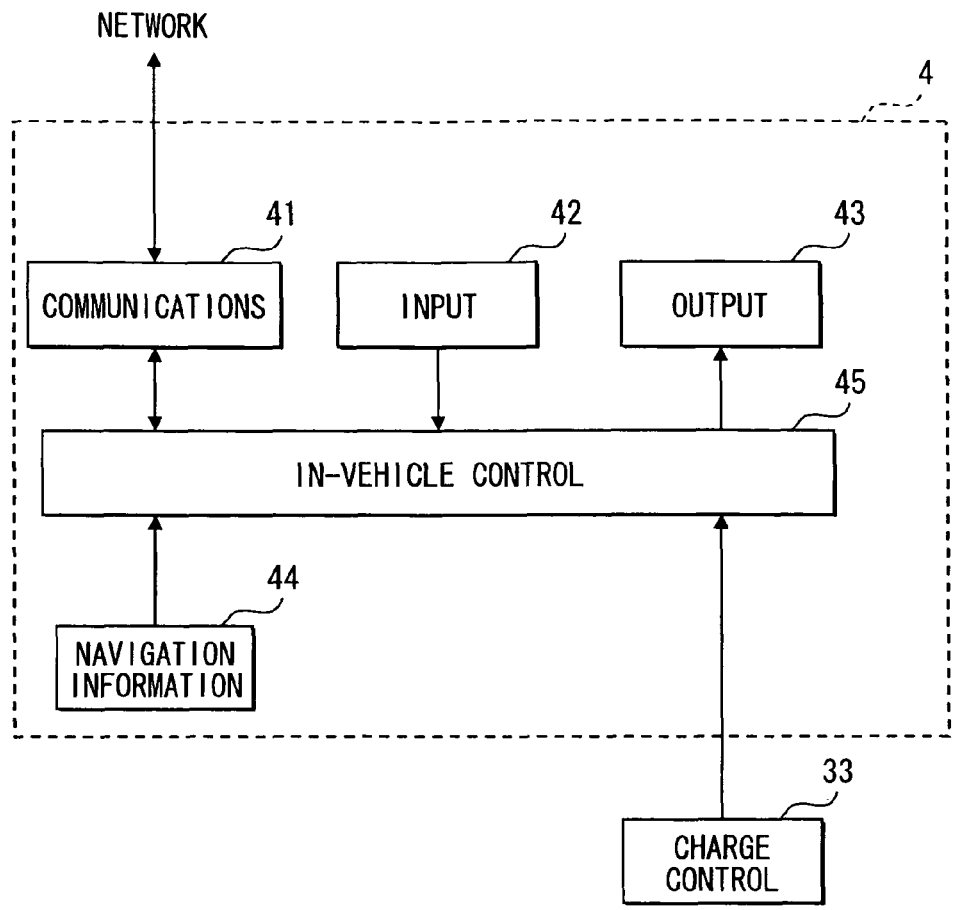
FIG. 5 is a block diagram schematically showing an electric power amount information output device in the first embodiment.
FIG. 6 is a table showing an example of table, which defines the correspondence between external devices and electric power consumption.

The output device 4 is configured to output information about the remaining electric charge amount of the battery 32 of the vehicle 3. As shown in FIG. 5, the output device 4 is configured to include an in-vehicle communications unit 41, an input unit 42, an output unit 43, a navigation information acquisition unit 44 and an in-device control unit 45.

The in-vehicle communications unit 41 communicates with the charging management center 1 through the communications network such as the Internet network. Specifically, the in-vehicle communications unit 41 transmits the request signal, which requests the transmission of the availability information, to the charging management center 1 in response to the command from the in-vehicle control unit 45. The in-vehicle communications unit 41 further receives and transmits the availability information transmitted from the charging management center 1 in correspondence to the request signal. The in-vehicle communications unit 41 thus operates as availability information acquisition section. The in-vehicle communications unit 41 transmits the request signal for the temporary reservation in response to a command from the in-vehicle control unit 45. This request signal requests the temporary reservation, which limits the use of the specified charger device 23 of the charging station 2 to only a temporary use (for example, a few minutes) by a specified user. The in-vehicle communications unit 41 also transmits the request signal for the formal reservation in response to a command from the in-vehicle control unit 45. This request signal requests the formal reservation, which limits the use of the specified charger device 23 of the charging station 2 to only a use by a specified user for a specified time period.

The input unit 42 is configured to receive inputs from users. For example, the input unit 42 may include touch switches or mechanical switches, which are integrated with a display device, to command various functions to the in-vehicle control unit 45 by switch operations.

The output unit 43 is configured to output information to users. The output unit 43 thus operates as a output section. For example, the output unit 43 may be configured as a display device, which provides the information by visually displaying texts or images, or a sound output device, which provides the information by audible sounds. The output unit 43 is assumed to be a display device, which visually displays texts or images. The display device may be a display of a navigation device provided in a vehicle.

The navigation information acquisition unit 44 acquires information from the navigation device provided in the vehicle 3. The information, which the navigation information acquisition unit 44 acquires from the navigation device, includes present position, departure point, map data, facilities, guidance route, travel candidate route and the like. The navigation information acquisition unit 44 transmits the acquired information to the in-vehicle control unit 45. The navigation information acquisition unit 44 operates as a position information acquisition section and a route information acquisition section.

The present position information indicates the present position of the vehicle 3. This present position information may be detected by a position detector such as a terrestrial magnetism sensor, a gyroscope, a travel speed sensor and a GPS receiver of a conventional navigation device. The departure point information and the destination point information correspond to coordinates of positions inputted in the navigation device as the departure point and the destination point of the vehicle 3, respectively.

The map data includes link data and node data of a road. The link connects nodes, when each road on a map is divided by a plurality of nodes, at which roads cross, branch and join. A road is formed by connecting the links. The link data includes a specific number (link ID) for specifying a link, a link length indicating a length of a link, a link travel time, a link direction, a link orientation, node coordinates (latitudes and longitudes) of a start and an end of the link, a road name, a road type, a road width, number of traffic lanes, presence and absence of traffic lanes exclusive to right turn and left turn, the number of exclusive traffic lanes, travel speed limits and the like. The node data includes a node ID specifically assigned to each node, at which the roads on the map cross, join and branch, a node coordinate, a node name, a connecting link ID of a link connected to the node coordinate. The node data also includes various data about a type of road crossing. The facility information is information about a type, name, address and a coordinate position of installation of each facility. The facility information includes the coordinate of the position of installation of the charging station 2.

The guidance route information is information of a guidance route determined as a result of searching for an appropriate travel route by using a conventional Dijkstra method in the navigation device. The appropriate travel route is selected from a plurality of routes, which the vehicle 3 can travel, based on the inputted departure point and the inputted destination point. The appropriated travel route is selected to satisfy a predetermined condition such as priority for travel distance or travel time. The travel candidate route information is information about routes, which the vehicle 3 can pass. The navigation information acquisition unit 44 operates as a departure point information acquisition section and a destination point information acquisition section.

The in-vehicle control unit 45 is configured with a microcomputer, which includes a CPU, a ROM, a RAM, a backup RAM, an I/O and the like, although not shown in the figures. The in-vehicle control unit 45, particularly its CPU, performs various processing by executing various control programs stored in the ROM based on various information inputted from the charge control unit 33, the in-vehicle communications unit 41, the input unit 42 and the navigation information acquisition unit 44. The various processing may be, for example, calculation of a required total electric power amount indicating a total amount of electric power required for arriving at the destination point, calculation of a required minimum electric power amount, search for a charging station, calculation of an estimated station-arrival time indicating estimated time of arrival at the charging station, calculation of a required supplemental electric power amount, calculation of a charging start time, calculation of an estimated destination-arrival time indicating an estimated time of arrival at the destination position, calculation of a total electric power consumption amount for arriving at the destination point, priority display, temporary reservation, formal reservation, disturbance correction, etc.

In the calculation processing of a required total electric power amount for arriving at the destination point, the in-vehicle control unit 45 acquires guidance route information based on the departure point information and the destination point information acquired by the navigation information acquisition unit 44. The guidance route information indicates a guidance route, along which the vehicle 3 is guided from the departure point to the destination point. For example, the guidance route information may be the information, which is acquired by the navigation information acquisition unit 44. The in-vehicle control unit 45 calculates the required total electric power amount as the total electric power amount required for the vehicle 3 to travel from the departure point to the destination point based on the guidance route information. The in-vehicle control unit 45 operates as a calculation section for calculating the required total electric power amount. The in-vehicle control unit 45 may use destination point information, which is inputted by the input unit 42, in this calculation. The input unit 42 thus operates as a destination point information acquisition section. The in-vehicle control unit 45 may also use this destination point information inputted by the input unit 42 in other calculations. The input unit 42 thus operates as a destination point information acquisition section.

For the calculation of the required total electric power amount, the in-vehicle control unit 45 may pre-store in its memory information about an average electric power consumption amount per a predetermined distance of the battery 32. The in-vehicle control unit 45 may calculate the total distance of the guidance route by adding the length of each link of the guidance route based on the map data acquired by the navigation information acquisition unit 44. The in-vehicle control unit 45 may calculate the required total electric power amount based on the total distance of the guidance route and the average electric power consumption amount. Alternatively, the in-vehicle control unit 45 may acquire a limit travel speed predetermined for each link of the guidance route based on the map data acquired by the navigation information acquisition unit 44. The in-vehicle control unit 45 may calculate the electric power consumption amount of the battery 32 for each link of the guidance route based on the limit speed. The in-vehicle control unit 45 may calculate the required total electric power amount by adding the calculated electric power consumption amount of each link.

The in-vehicle control unit 45 further checks whether the remaining electric power amount of the battery 32 of the vehicle 3, which is available at the departure point, is less than the calculated required total electric power amount. If the remaining electric power amount is less than the calculated required total power amount, the in-vehicle control unit 45 drives the output unit 43 to display insufficient remaining electric power amount information, which indicates that the remaining electric power amount of the battery 32 is insufficient for the vehicle 3 to arrive at the destination point with only the remaining electric power amount of the battery 32. The in-vehicle control unit 45 thus operates as a control section.

In case of displaying the insufficient remaining electric power amount information by the output unit 43, the in-vehicle control unit 45 may drive the output unit 43 to display availability information about the charging station 2 based on the availability information of the charging station 2 received by the in-vehicle communications unit 41. Thus the user is enabled to determine, in consideration of the availability of each charging station 2, where the battery 32 should be charged before arriving at the destination point.

In the calculation processing of the required minimum electric power amount, the in-vehicle control unit 45 acquires information about the location of the charging station, which is nearest to the departure point, based on the departure point information and the facility information of the map data acquired by the navigation information acquisition unit 44. The in-vehicle control unit 45 calculates the required minimum electric power amount, which will be required to travel from the departure point to the nearest charging station, based on the acquired information about the departure point and the nearest station. The in-vehicle control unit 45 thus operates as a nearest station location information acquisition section and a required minimum electric power amount calculation section.

For the calculation of the required minimum electric power amount based on the nearest station location information and the departure point information, the in-vehicle control unit 45 may calculate a straight line distance (shortest distance) between the departure point to the nearest charging station location and further calculate the required minimum electric power amount based on the calculated straight line distance and the calculated average electric power consumption amount. The in-vehicle control unit 45 may determine a travel route (for example, shortest travel route) from the departure point to the nearest station location and calculate the required minimum electric power amount based on a distance of the determined travel route and the average electric power consumption amount. Alternatively, based on the limit travel speed predetermined for each link of the determined travel route, the in-vehicle control unit 45 may calculate the electric power consumption amount of the battery 32 for each link of the determined travel route and calculate the required electric power amount for arriving at the destination point by adding the calculated electric power consumption amount of each link. The distance of the determined travel route may be calculated in the similar manner as in the case of the guidance route. The limit speed of each link of the determined travel route may be acquired in the similar manner as in the case of the guidance route. The route may alternatively be determined by acquiring through the unit 44 the guidance route, which is determined by the navigation device based on the departure point information and the nearest station location information.

The in-vehicle control unit 45 checks whether the remaining electric power amount of the battery 32 of the vehicle 3, which is available at the departure point, is less than the calculated required minimum electric power amount. If the remaining electric power amount is less than the calculated required minimum power amount, the in-vehicle control unit 45 drives the output unit 43 to display charge request information, which indicates that the battery 32 need be charged before leaving the departure point, as information regarding the remaining electric charge, that is, available electric power, of the battery 32. Thus, if the remaining electric power amount of the battery 32 at the departure point is less than the minimum electric power amount, which is required for the vehicle to travel from the departure point to the nearest charging station 2, the user can be notified that the battery 32 should be charged sufficiently at the departure point.

In the charging station search processing, the in-vehicle control unit 45 searches for charging stations 2, which the vehicle 3 will be able to reach with the remaining electric power of the battery 32, based on the remaining electric power amount information acquired from the charge control unit 33, the departure point information acquired by the navigation information acquisition unit 44 and the facility information of the map data. The charging station 2 located within a distance, which the vehicle 3 can travel with the remaining electric power, is referred to as a reachable charging station. The in-vehicle control unit 45 may calculate a distance, which the vehicle 3 can travel from the departure point, based on the remaining electric power amount and the average electric power consumption amount, and select the reachable charging station, which is located within the calculated distance. The in-vehicle control unit 45 thus operates as a remaining electric power amount information acquisition section. The distance from the departure point to the location of the reachable charging station may be calculated as a straight line distance or as the shortest travel route from the departure point to the reachable charging station. Alternatively, the in-vehicle control unit 45 may search for the charging station 2 by calculating the electric power amount required to travel from the departure point to each location of the charging stations 2 and selecting the reachable charging station, the calculated electric power amount for which is less than the remaining electric power amount of the battery 32. The in-vehicle control unit 45 may calculate the electric power amount required to travel from the departure point to each charging station 2 based on a straight line distance from the departure point to the charging station 2 and the average electric power consumption amount. The in-vehicle control unit 45 may alternatively calculate it based on a distance of a travel route (for example, shortest travel route) from the departure point to the charging station 2 and the average electric power consumption amount. The in-vehicle control unit 45 may still alternatively calculate it based on a distance of a travel route (for example, shortest travel route) from the departure point to the charging station 2 and the limit speed in each link of the travel route.

In the charging station search processing, the in-vehicle control unit 45 may select the charging station 2, which is limited to be located along the travel route of the vehicle 3 between the departure point and the destination point, based on candidate travel route information acquired by the navigation information acquisition unit 44. According to this processing, the in-vehicle control unit 45 can eliminate charging stations located along a route, which the vehicle 3 is less likely to take, in searching for the charging station. Thus the in-vehicle control unit 45 can provide only useful information about the charging stations 2 by eliminating useless information.

The in-vehicle control unit 45 drives the output unit 43 to display availability information about the charging station 2, which is searched and selected, based on the search result and the availability information about the charging stations 2 acquired by the in-vehicle communications unit 41. The availability information about the charging station 2 selected as a result of searching may be displayed visually as a table, which correlates a charging station name (for example, numbers, symbols or the like) of each charging station and availability information (for example, YES or NO) indicating whether the charging station is available or unavailable for charging. The display of the charging stations may be limited to only the charging station, which is available. Such a charging station is displayed with its station name. Thus, the charging stations 2, which the vehicle 3 will not be able to reach with its remaining electric power of the battery 32, can be eliminated from display of the availability information. As a result, only the useful information can be provided to the user by eliminating unnecessary information.

In the calculation processing of the estimated station-arrival time indicating an estimated time of arrival at the charging station, the in-vehicle control unit 45 calculates the estimated arrival time at each charging station 2 based on the departure point information and the facility information of the map data, which are acquired by the navigation information acquisition unit 44, and the scheduled departure time information of the vehicle 3 inputted by the input unit 42. The input unit 42 thus operates as a scheduled departure time acquisition section. The in-vehicle control unit 45 thus operates as an estimated charging station arrival time calculation section.

For example, the in-vehicle control unit 45 may determine the travel route (for example, shortest travel route) to each charging station 2 based on the departure point information and the location information of each charging station 2, and calculates a travel time required to travel from the departure point to each charging station 2 based on a link distance travel time of each link. The in-vehicle control unit 45 may calculate the estimated station-arrival time for each charging station 2 by adding the calculated travel time to each charging station 2 to the scheduled departure time. The link distance travel time for each link of the travel route may be determined from the map data acquired by the navigation information acquisition unit 44 or may be acquired from a VICS (Trademark) center or the like.

The in-vehicle control unit 45 drives the output unit 43 to display the availability information of the searched charging station 2 and the estimated arrival time at such a charging station based on the search result of the charging station search and the calculation result of the estimated station-arrival time. In displaying the availability information about the searched charging station 2 and the estimated station-arrival time, the in-vehicle control unit 45 may display the name of the charging station 2, which is available for charging the battery 32 of the vehicle 3, as well as the estimated station-arrival time indicating the estimated time of arrival of the vehicle 3 at such a charging station 2 as a list in the order of estimated time of arrival from the earliest to the latest. The charging station corresponding to the earliest estimated time of arrival is preferably listed at the top in the list. The user is thus enabled to recognize at which charging station the vehicle 3 can reach at the earliest time and charge the battery 32 at such a charging station.

The in-vehicle control unit 45 may drive the output unit 43 to display only the availability information with respect to the charging stations 2, at which the vehicle 3 will arrive after the estimated station-arrival time. The in-vehicle control unit 45 can thus eliminate the display of the availability information of the charging station 2, at which the vehicle 3 will arrive before arriving at the charging station. By thus eliminating the output of unnecessary information, only the useful information can be provided to the user.

In the required supplemental electric power amount calculation processing, the in-vehicle control unit 45 calculates a required supplemental electric power amount, which is required to be supplemented at a charging station for the vehicle 3 to travel from the departure point to the destination point by passing through the subject charging station 2, based on the remaining electric power amount information acquired by the charge control unit 33 as well as the departure point information, the destination point information and the facility information of the map data acquired by the navigation information acquisition unit 44. The in-vehicle control unit 45 calculates the required supplemental electric power amount (required additional charge amount), which is required to be charged to the battery 32 at the charging station 2 for the vehicle 3 to travel from the charging station 2 to the destination point. The in-vehicle control unit 45 thus operates as a required supplemental electric power amount calculation section.

For example, the in-vehicle control unit 45 may calculate the required electric power amount required for the vehicle 3 to travel from the departure point to the location of the charging station 2 and subtract this calculated required electric power amount from the remaining electric power amount of the battery 32. The in-vehicle control unit 45 thus calculates the remaining electric power amount of the battery 32, which is available at the time of arrival at the charging station 2. In the similar manner as the calculation of the electric power amount required to travel from the departure point to the location of the charging station 2, the in-vehicle control unit 45 calculates a required electric power amount required for the vehicle 3 to travel from the location of the charging station 2 to the destination point based on the location information of the charging station 2 and the destination point information. The in-vehicle control unit 45 may calculate the required supplemental electric power amount by subtracting the remaining electric amount available at the time of arrival at the charging station 2 from the electric power amount required for the travel from the charging station 2 to the destination point.

In the charging start time calculation processing, the in-vehicle control unit 45 calculates the charging start time, at which the charging can be started to charge the battery 32 to the required charge amount by the charging station 2, based on the availability information of the charging station 2 received by the in-vehicle communications unit 41 and the required charge amount calculated in the required supplemental electric power amount calculation. The in-vehicle control unit 45 thus operates as a charging start time calculation section.

For example, the in-vehicle control unit 45 searches for a time zone, in which the battery 32 can be charged continuously to add the required supplemental electric power amount, based on the estimated station-arrival time, information about time zones in which the charger device 23 of the charging station 2 is available and the required supplemental electric power amount. This time zone is one of time zones, in which the charger device 23 is available after the estimated station-arrival time of the vehicle 3. The in-vehicle control unit 45 determines the charging start time in the earliest time zone among the searched time zones to be the charging start time.

The in-vehicle control unit 45 drives the output unit 43 to display the availability information, which is acquired as a result of the charging station searching, and the calculated charging start time of the charging station 2. The in-vehicle control unit 45 may display, as the availability information and the charging start time of the charging station 2, names of the available charging stations and respective charging start times, in a list in the order of time of the charging start time. The earliest time is preferably displayed at the top in the list. Thus, the user can recognize at which charging station the battery 32 of the vehicle 3 can be charged by an amount corresponding to the required supplemental electric power amount at the earliest time. The user can complete the required supplemental charging at the earliest time by traveling to such a charging station. The user can thus minimize the wait time for starting the charging of the battery 32 by selecting the charging station 2, at which the charging can be started at the earliest.

In the calculation processing of the estimated destination-arrival time, the in-vehicle control unit 45 calculates an estimated time of arrival at the destination point, at which the vehicle 3 will arrive after charging the battery 32 to add the required supplemental electric power amount at the charging station 2, based on the availability information of the charging station 2 received by the in-vehicle communications unit 41, the required supplemental electric power amount calculated in the required supplemental electric power amount calculation and the facility information and the destination point information of the map data acquired by the navigation information acquisition unit 44. The in-vehicle control unit 45 thus operates as an estimated destination-arrival time calculation section.

For example, the in-vehicle control unit 45 calculates a charge completion time, at which the charging of the battery 32 to add the required supplemental electric power amount will be completed, based on the charging start time calculated in the charging start time calculation and the required supplemental electric power amount. The in-vehicle control unit 45 further calculates a travel time required for the vehicle 3 to travel from the charging station 2 to the destination point based on the location information about the charging station 2 and the destination point information. The in-vehicle control unit 45 may calculate the estimated destination-arrival time by adding the travel time from the charging station 2 to the destination point to the charging completion time. The time required to supplementarily charge the battery 32 may be calculated in proportion to the required supplemental electric power amount. The travel time from the charging station 2 to the destination point may be calculated in the similar manner as in the case of the calculation of travel time from the departure point to the charging station 2.

The in-vehicle control unit 45 drives the output unit 43 to display the availability information acquired as a result of the charging station search and the estimated destination-arrival time calculated in the estimated destination-point arrival time calculation. The in-vehicle control unit 45 may display, as the availability information and the estimated destination-arrival time, names of the available charging stations and the corresponding estimated times of arrival at the destination point, in a list in the order of the estimated destination-arrival time from the top of the list. The user can thus recognize which of the charging stations 2 can enable the earliest arrival at the destination point, the user can arrive at the destination point in the shortest time by charging the battery 32 at such a charging station 2 as displayed on the top in the list.

In the calculation processing of the total electric power consumption amount for arriving at the destination point, the in-vehicle control unit 45 calculates the total electric power consumption amount for arriving at the destination point, which is required for the vehicle 3 to arrive at the destination point through the charging station 2, based on the departure point information, the destination point information and the facility information of the map data acquired by the navigation information acquisition unit 44. The in-vehicle control unit 45 thus operates as a calculation section for calculating the total electric power consumption amount.

For example, the in-vehicle control unit 45 may determine a travel route from the departure point to the destination point by way of the charging point based on the departure point information, the destination point information and the location point of the charging station 2 and calculate the total electric power consumption amount for arriving at the destination point based on the distance of the determined travel route and the average electric power consumption amount. Alternatively, the in-vehicle control unit 45 may calculate the total electric power consumption amount by calculating the electric power consumption amount in each link of the determined travel route based on the limit speed provided in correspondence to each link in the travel route.

The in-vehicle control unit 45 drives the output unit 43 to display the availability information about the charging station 2 acquired as a result of the charging station search and the total electric power consumption amount. The in-vehicle control unit 45 may display, as the availability information and the total electric power consumption amount, names of the available charging stations and the total corresponding electric power consumption amount, in a list in the order of the total electric power consumption amount. The charging station 2, which corresponds to the least total electric power consumption amount, is preferably listed at the top. The user can thus recognize which of the charging stations 2 can enable the arrival at the destination point with the least total electric power consumption amount, the user can arrive at the destination point with the least total electric power consumption amount by charging the battery 32 at such a charging station 2 as displayed on the top in the list. It is thus possible to reach the destination point by reducing the charging cost to be as low as possible.

The information displayed by the output unit 43 with the charging station availability information may be a travel time to the charging station 2 determined as a result of charging station search, in addition to the estimated station-arrival time, the charging start time, the estimated destination-arrival time and the total electric power consumption amount.

In the priority display processing, if there are two or more number of types of information to be displayed by the output unit 43 with the availability information, the in-vehicle control unit 45 rearranges the order of display of such information received by the input unit 42 in correspondence to the input of the user, who determines which one of a plurality of information should be displayed with priority. For example, it is assumed the user selects by the input unit 42 the estimated destination-arrival time to be displayed with priority in case of displaying by the output unit 43 four types of information, which are the travel time, estimated station-arrival time, the charging start time and the estimated destination-arrival time.

In this case, the in-vehicle control unit 45 may drive the output unit 43 to display a set of information, which includes the name of the available charging station 2 among the charging stations 2 acquired as a result of charging station search, the travel time, the estimated station-arrival time, the charging start time and the estimated destination-arrival time, while listing each set of information in the order of earliest one of the estimated destination-arrival time. The input unit 42 thus operates as a prioritized input reception section.

In the temporary reservation processing, the in-vehicle control unit 45 drives the in-vehicle communications unit 41 to automatically transmit the request signal for the temporary reservation of the charging station 2, which is listed at the top as having the highest priority in the prioritized display processing. The in-vehicle communications unit 41 thus operates as a temporary reservation request signal transmission section. For example, the in-vehicle control unit 45 may drive the communication section 41 to automatically transmit the temporary reservation request signal for the charging station 2, which will provide the earliest estimated destination-arrival time, in case that the charging stations 2 are listed from the top in the order of earlier estimated destination-arrival time in the priority display processing. The charging station 2, more specifically the charger device 23 of such a charging station, which is the subject for the temporary reservation, may be determined based on the individual charging station ID or the like. The user, who requests the temporary reservation, may be determined based on the individual vehicle ID or the like. Thus, the charging station 2, which the user is most likely to select as the charging station 2 for charging the battery 32, can be temporarily reserved as the charging point for the battery 32 in the automatic manner. It is therefore possible to avoid that such a charging station 2 will be reserved by other users before it is actually reserved by the user.

In the formal reservation processing, the in-vehicle control unit 45 drives the in-vehicle communications unit 41 to transmit the formal reservation signal for the charging station 2, which is actually selected by the user by way of the input unit 42. The user may select the charging station 2 for the formal reservation based on the list of the charging stations 2, which are acquired as a result of the charging station search processing and displayed on the output unit 43 with the availability information, the estimated station-arrival time, the charging start time, the estimated destination-arrival time, the total electric power consumption amount, the travel time to the charging station 2 and the like. The input unit 42 thus operates as a charging station selective input reception section. The in-vehicle communications unit 41 operates as a formal reservation request signal transmission section. In the similar manner as in the temporary reservation processing, the charging station 2, more specifically the charger device 23 of such a charging station, which is the subject for the formal reservation, may be determined based on the individual charging station ID or the like. The user, who requests the formal reservation, may be determined based on the individual vehicle ID or the like.

In the disturbance correction processing, the in-vehicle control unit 45 corrects electric power amounts required for travel based on disturbances, which will affect the electric power consumption amount of the battery 32 of the vehicle 3, to perform the above processing of calculation of the required total electric power amount, calculation of the required minimum electric power amount, searching for the charging station, calculation of the required supplemental electric power amount, calculation of the total electric power consumption amount and the like. Specifically, the in-vehicle control unit 45 acquires disturbance information by receiving input of types of disturbances to be taken in, determines the correction amount in accordance with the acquired disturbance information and corrects the electric power amounts required for the vehicle 3 to travel. The correction amount may be determined with reference to table data, which define the relation between the disturbance type and the correction amount as exemplarily shown in FIG. 6. The input unit 42 thus operates as a disturbance information acquisition section.

According to this embodiment, the electric power amount required for travel is corrected in accordance with the disturbance information, which will affect the electric power consumption amount of the battery 32 of the vehicle 3. The electric power required for travel can be corrected to a more appropriate value in view of influence of disturbances. As a result, the processing of calculation of the required total electric power consumption amount for arrival at the destination point, calculation of the required minimum electric power consumption amount, searching of the charging station, calculation of the required supplemental electric power amount, and calculation of the total electric power consumption amount can be performed more accurately.

FIG. 6 is an example of a table, which defines the relation between the types of disturbances and the electric power consumption amount. By this table, mode and electric power consumption amount (W) are stored in respect of each external device, which is a disturbance. For example, "air-conditioner (A/C)" is defined to consume 800W in the maximum cooling mode and 1.2 kW in the maximum heating mode. "Wiper" is defined to consume 62W in the low-speed wiping mode and 69W in the high-speed wiping mode. "Headlight" is defined to consume 70W in the ON mode. "Radio" is defined to consume 57W in the ON mode. "Navigation" is defined to consume 7W in the ON mode.

In place of defining the relation between the disturbances and the electric power consumption amounts in the table form, the relation between the disturbances and coefficients, which are used as multipliers to the electric power required to travel, may be defined in a table form.

The disturbance information may be inputted manually to be received by the input device 4 so that the in-vehicle control unit 45 may acquire the disturbance information. Alternatively, the disturbance information may be supplied automatically to the in-vehicle control unit 45 from various sensors and switches provided in the vehicle 3.

Figure 7:
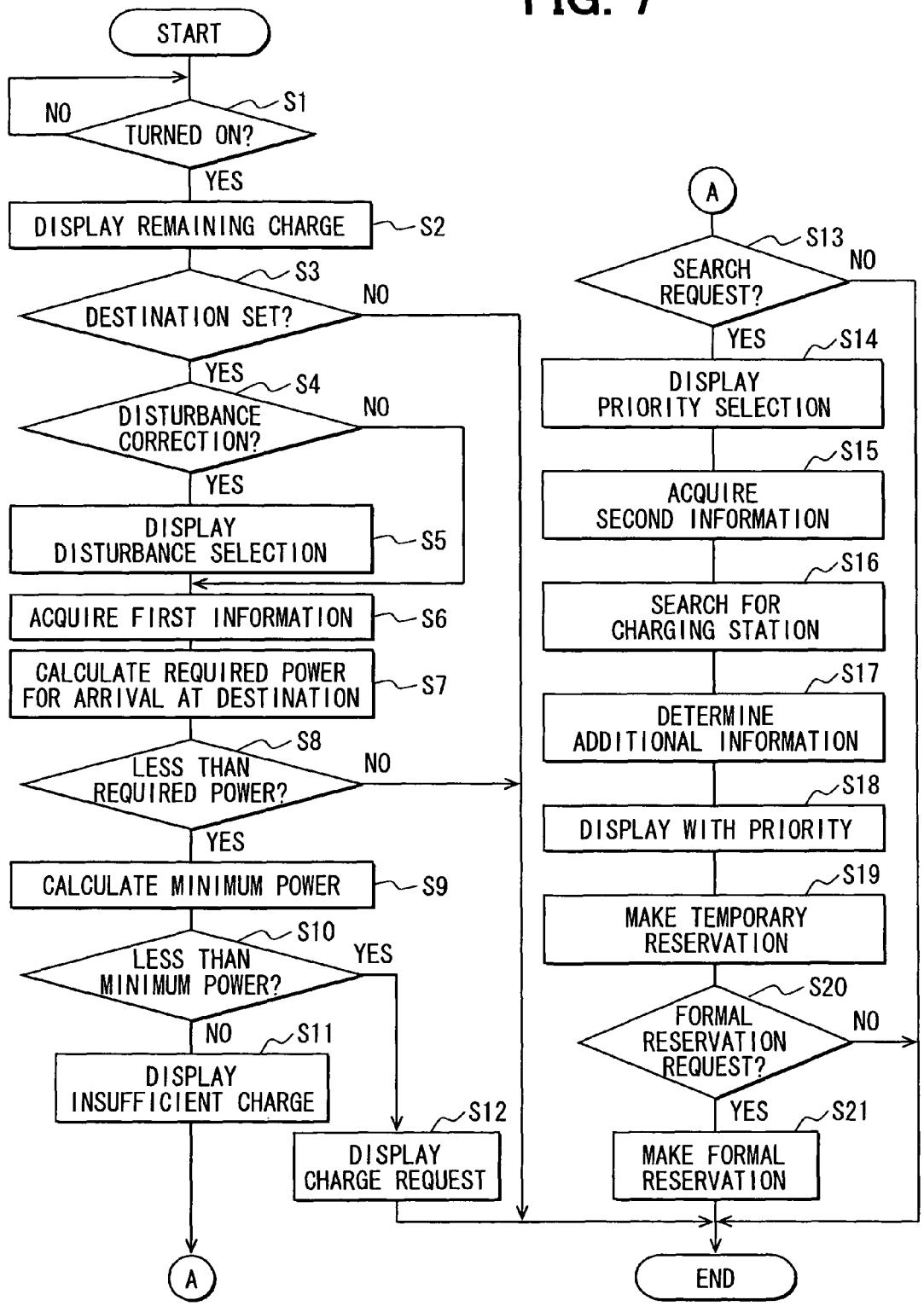
FIG. 7 is a flowchart showing processing of the electric power amount information output device shown in FIG. 5.

The operation of the electric power amount information output device 4 is further described with reference to the flowchart shown in FIG. 7.

The in-vehicle control unit 45 checks at step S1 whether the electric power amount information output device 4 is turned on. If it is turned on (Yes), step S2 is performed. If it is not turned on (No), step 1 is repeated.

Figure 8:
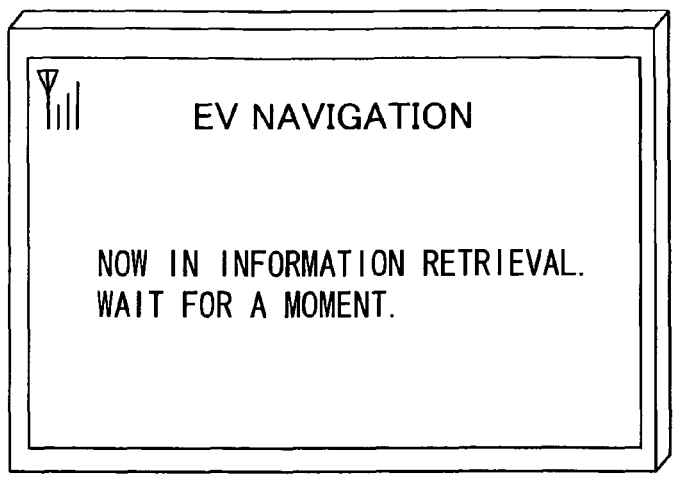
FIG. 8 is a diagram schematically showing an example of display by an output device shown in FIG. 5.
Figure 9:
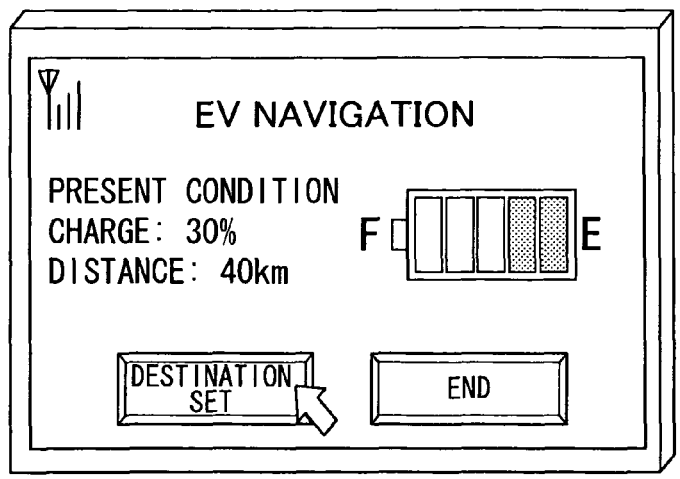
FIG. 9 is a diagram schematically showing an example of display by an output device shown in FIG. 5.

At step S2, the in-vehicle control unit 45 drives the output unit 43 to display the remaining electric charge amount (remaining electric power amount) of the battery 32 of the vehicle 3 at the departure point and the inquiry whether the user will set the destination point. Until the departure point remaining electric power amount display is performed, the output unit 43 may display a message, which indicates as shown in FIG. 8 that the information is being retrieved (acquired). As the display of the departure point remaining electric power amount, as shown in FIG. 9, the charge level (%), the travelable distance (km) or the meter indicating the charge condition may be provided as the present charge condition (present remaining electric power amount) of the battery 32. Further, a touch switch may be displayed as an inquiry whether the destination point will be set. The travelable distance, which the vehicle 3 will be able to travel with the remaining electric power, may be calculated based on the remaining electric power amount and the average electric power consumption amount.

The in-vehicle control unit 45 checks at step S3 whether the input unit 42 has accepted the input of the touch switch for destination point setting. If such a request is accepted (Yes), step S4 is performed. If it is not accepted (No), no more steps are performed. The destination point may be set by inputting the name and address or the like of the destination point by the input unit 42.

Figure 10:
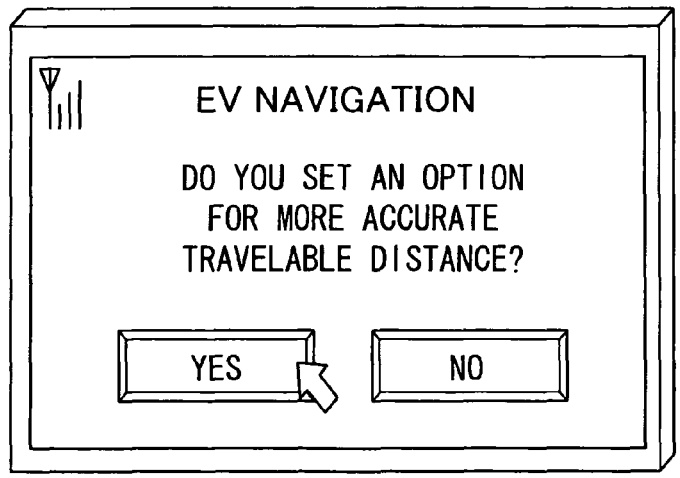
FIG. 10 is a diagram schematically showing an example of display by an output device shown in FIG. 5.

At step S4, the in-vehicle control unit 45 drives the output unit 43 to display a message, which inquires as shown in FIG. 10 whether the user will request the disturbance correction processing. If the request for the disturbance correction processing is received by the input unit 42 (Yes), step S5 is performed. If such a request is not received by the input unit 42 (No), step S6 is performed.

Figure 11:
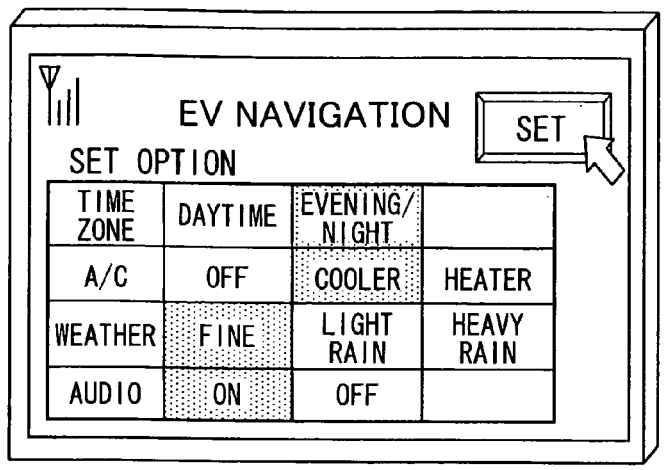
FIG. 11 is a diagram schematically showing an example of display by an output device shown in FIG. 5.

At step S5, the in-vehicle control unit 45 drives the output unit 43 to display a message, which advises the user to select the type of disturbances to be taken in. The correction amount is determined in correspondence to the disturbance, which the user selected and inputted to be taken in. The disturbance selection display may be a display of a touch switch shown in FIG. 11, which the user can select. In the example of FIG. 11, the disturbances include "time zone," "air-conditioner (A/C)," "weather" and "audio". As for "time zone," either "daytime (headlight: OFF)" or "evening/night (headlight: ON)" is selectable. As for "A/C," "OFF," "cooler" or "heater" is selectable. As for "weather," "fine (no wiper)," "light rain (wiper: Low)" or "heavy rain (wiper: High)" is selectable. As for "audio," "ON" or "OFF" is selectable.

In the example of FIG. 11, "evening/night," "cooler," "fine" and "ON" are selected with respect to "time zone," "A/C," "weather" and "audio," respectively. According to this example of selected disturbances, the correction value is calculated in the disturbance correction processing with reference to the table data shown in FIG. 6 in the following manner. Since "evening/night (headlight: ON)" is selected as "time zone," electric power 70W of "headlight: ON (Hi)" is referred to. Since "cooler" is selected as "A/C," electric power 800W of "maximum cooling" is referred to. Since "fine" is selected as "weather," electric power 0W (no wiper operation) is set as a default value. Since "ON" is selected as "audio," electric power 57W of a radio receiver is referred to. The correction value is finally determined to be 927W (=70W+800W+0W+57W) in the disturbance correction processing. The correction value is determined to be 0W, if no input is received by the input unit 42 for the disturbance correction.

At step S6, the in-vehicle control unit 45 performs first information acquisition processing. In this first information acquisition processing, the in-vehicle control unit 45 acquires the departure point information acquired by the navigation information acquisition unit 44, the remaining electric power information acquired by the charge control unit 33, the destination point information received by the input unit 42 and the disturbance information. The in-vehicle control unit 45 further acquires the guidance route information from the navigation information acquisition unit 44 based on the departure point information and the destination point information. The guidance route information need not be acquired from the navigation device mounted in the vehicle but may be acquired from a data center or the like, which determines the guidance route outside the vehicle, by way of the in-vehicle communications unit 41.

At step S7, the in-vehicle control unit 45 performs the calculation of the required total electric power amount, which will be required for arrival at the destination point. At S8, the in-vehicle control unit 45 checks whether the remaining electric power of the battery 32 of the vehicle 3 available at the departure point is less than the required total electric power amount, which is calculated at step S7. If the remaining electric power amount of the battery 32 is less than the required total electric power amount (Yes), step S9 is performed to calculate the required minimum electric power for reaching a charging station 2. If the remaining electric power amount of the battery is not less than the required total electric power amount (No), no more steps are executed.

Figure 12:
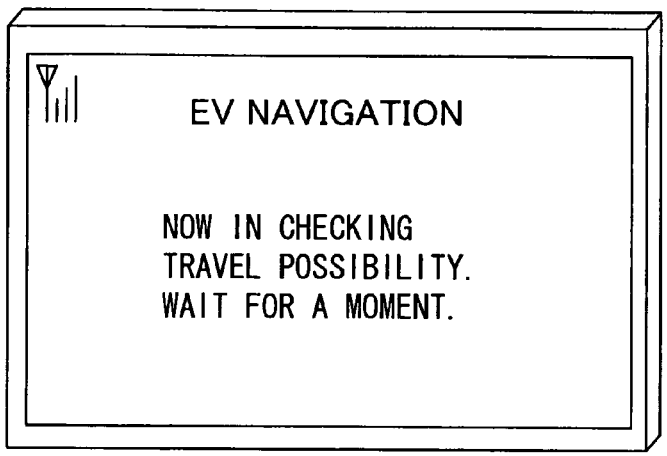
FIG. 12 is a diagram schematically showing an example of display by an output device shown in FIG. 5.

During execution of steps S6 to S8, the in-vehicle control unit 45 may drive the output unit 43 to display, for example, that it is under process of checking whether the vehicle 3 can travel to the destination point with only the remaining electric power amount of the battery 32. One such example is shown in FIG. 12. If the remaining electric power amount of the battery 32 is not less than the required total electric power amount (S8: No), the in-vehicle control unit 45 may drive the output unit 43 to display that the vehicle 3 will be able to travel to the destination point with only the remaining electric power of the battery 32.

At step S9, the control unit 45 performs the required minimum electric power amount calculation processing to calculate the required minimum electric power, which is required for reaching a charging station. Then at step S10, the in-vehicle control unit 45 checks whether the remaining electric power amount is less than the required minimum electric power amount. If the remaining electric power amount is less than the required minimum electric power amount (Yes), that is, if the vehicle 3 will not be able to reach any of the charging stations 2, the in-vehicle control unit 45 performs step S12. If the remaining electric power amount is not less than the required minimum electric power amount (No), the in-vehicle control unit 45 performs step S11.

Figure 13:
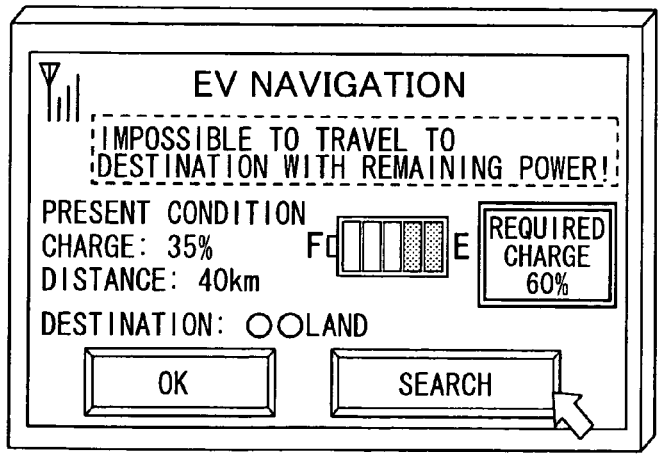
FIG. 13 is a diagram schematically showing an example of display by an output device shown in FIG. 5.

At step 11, the in-vehicle control unit 45 drives the output unit 43 to display electric charge insufficiency information indicating that that the remaining electric power of the battery 32 is not sufficient and should be supplemented. As the display of the electric charge insufficiency information, as shown in FIG. 13, the charge level (%), the travelable distance (km) or the meter indicating the charge condition may be provided as the present remaining electric power amount (present charge condition) of the battery 32. Further, touch switches may be displayed as inquiries whether the destination point should be displayed and whether the charging station 2, which the vehicle 3 will be able to reach with the remaining electric power of the battery 32, should be searched for.

At step S12, the in-vehicle control unit 45 drives the output unit 43 to display the charge request information, which indicates that the battery 32 should be charged before starting to travel from the departure point. This display thus advises the user to charge the battery 32 at the departure point or immediately. The charge request information may be displayed following the electric charge insufficiency information or together with the same. At step S12, it is preferred not to display the touch switch for inquiring whether the charging stations should be searched for.

Following step S11, the in-vehicle control unit 45 checks whether the charging station search is requested by the touch switch displayed on the input unit 42 at step S11. If such a search is requested (Yes), step S14 is performed. If no such search request is inputted on the input unit 42 (No), no more steps are performed.

Figure 14:
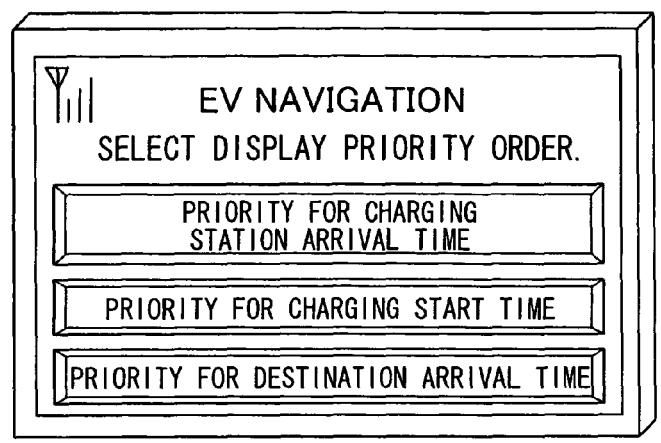
FIG. 14 is a diagram schematically showing an example of display by an output device shown in FIG. 5.

At step S14, the in-vehicle control unit 45 drives the output unit 43 to provide a display (priority selection display) as shown in FIG. 14, as an example. This display advises the user to select information to be displayed with priority among a variety of available information displayed on the output unit 43. The available information corresponds to display information. The in-vehicle control unit 45 determines the type of display, which should be provided with priority in accordance with input of the user, who selects the information to be prioritized. As the priority selection display, as shown in FIG. 14, a touch switch display may be provided so that the user may select the type of display, which should be prioritized. In the example of FIG. 14, the display touch switch includes the following three types of items:

"priority for charging station arrival time," which prioritizes the estimated station-arrival time;

"priority for charging start time," which prioritizes the start time of charging the battery 32; and "priority for estimated destination arrival time," which prioritizes the estimated destination-arrival time.

The information displayed by the output unit 43 in addition to the available information are assumed to be four types, that is, the travel time, the estimated station-arrival time, the charging start time and the estimated destination-arrival time. It is further assumed that the display, which can be prioritized, is limited to three information, that is, the station-arrival time, the charging start time and the estimated destination-arrival time. That is, the travel time is not prioritized.

At step S15, the in-vehicle control unit 45 performs second information acquisition processing. In this processing, the in-vehicle control unit 45 acquires information, which is used in additional information calculation processing described later. For example, in the second information acquisition processing, the in-vehicle control unit 45 further acquires the map data and travel candidate route information acquired by the navigation information acquisition unit 44 as well as the charging station availability information received by the in-vehicle communications unit 41 and the like.

At step S16, the in-vehicle control unit 45 performs the charging station search processing. At step S17, the in-vehicle control unit 45 performs the required additional information calculation processing with respect to the charging station 2 determined as a result of the charging station search processing. In the required additional information calculation processing, with respect to the charging station 2 acquired as a result of the charging station search processing, the in-vehicle control unit 45 performs the estimated station-arrival time calculation processing, the required supplemental electric power amount calculation processing, the charging start time calculation processing, the total electric power consumption amount calculation processing and the like. The in-vehicle control unit 45 further calculates the travel time, the estimated station-arrival time, the charging start time, the estimated destination-arrival time, the total electric power consumption amount and the like. In this embodiment, the in-vehicle control unit 45 is assumed to calculate the travel time, the estimated station-arrival time, the charging start time and the estimated destination-arrival time by performing the estimated station-arrival time calculation processing, the required supplemental electric power amount calculation processing, the charging start time calculation processing and the estimated destination-arrival time calculation processing.

Figure 15:
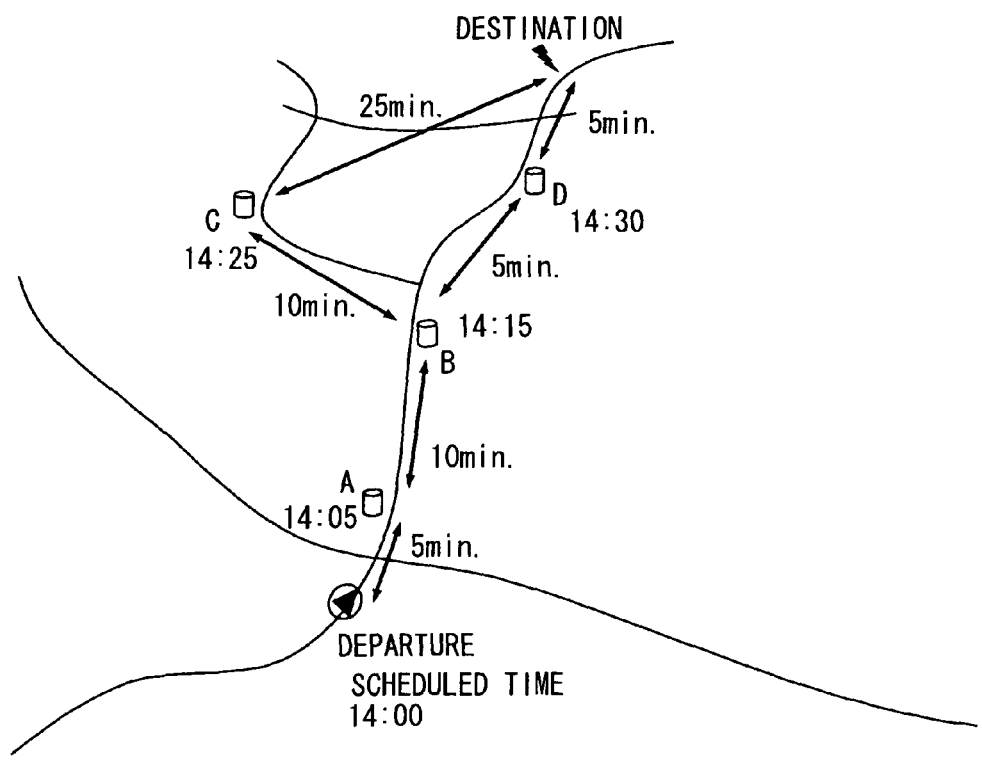
FIG. 15 is a map schematically showing a positional relation between a destination and charging stations, which are determined as a result of a departure point and a search result of searching for the charging stations.

In this example, it is assumed that four charging stations 2, which are indicated as station names A, B, C and D, are acquired as shown in FIG. 15 as a result of the charging station search processing. FIG. 15 schematically shows the relation between the locations of the four charging stations A, B, C, D and the destination point. The travel time are assumed to be 5 minutes from the departure point to the charging station A, 10 minutes from the charging station A to the charging station B, 10 minutes form the charging station B to the charging station C, 5 minutes from the charging station B to the charging station D, 25 minutes from the charging station C to the destination point and 5 minutes from the charging station D to the destination point. The vehicle 3 is assumed to stay for a period of 10 minutes at any of the charging stations A to D to charge the battery 32 for the required supplemental electric power.

It is also assumed in this example that, by the estimated station-arrival time calculation processing, the estimated station-arrival times are calculated to be 14:05 for A, 14:15 for B, 14:25 for C and 14:30 for D. It is further assumed that, by the charging start time calculation processing, the charging start times are calculated to be 14:35 for A, 14:45 for B, 14:25 for C and 14:35 for D. It is still further assumed that, by the estimated destination-arrival time calculation processing, the estimated destination-arrival times are calculated to be 15:15 by way of A, 15:25 by way of B, 15:00 by way of C and 14:50 by way of D.

At step S18, the in-vehicle control unit 45 performs the priority display processing. For example, if "priority for charging station arrival time" is selected at step S14, the in-vehicle control unit 45 drives the output unit 43 to provide a display as shown in FIG. 16. The charging stations are listed from top to bottom in the order of A, B, C, D, based on the earliest order of the estimated station-arrival time. If "priority for charging start time" is selected at step S14, the in-vehicle control unit 45 drives the output unit 43 to provide a display as shown in FIG. 17. The charging stations are listed from top to bottom in the order of C, D, A, B, based on the earliest order of the charging start time. If "priority for estimated destination-arrival time" is selected at step S14, the in-vehicle control unit 45 drives the output unit 43 to provide a display as shown in FIG. 18. The charging stations are listed from top to bottom in the order of D, C, A, B, based on the earliest order of the estimated destination point arrival time.

At step S19, the in-vehicle control unit 45 performs the temporary reservation processing. At step S20, the in-vehicle control unit 45 checks whether the input device 42 has already received the formal reservation request from the user. If the formal request has already been received (Yes), the in-vehicle control unit 45 performs step S21. If no formal request has been received (No), the in-vehicle control unit 45 performs no more steps. At step S21, the in-vehicle control unit 45 performs the formal reservation processing.

According to the embodiment, it is possible for the user to recognize whether the vehicle 3 can reach the destination point from the departure point with only the remaining electric power amount of the battery 32. As a result, the user can charge the battery 32 at the departure point or confirm the location of the charging station 2, at which the user can charge the battery 32 of the vehicle 3 before arriving at the destination point. The user is released from worrying about whether the vehicle 3 can reach the destination point with only the remaining electric power of the battery 32 on the way to the destination point. Since the user can check whether the vehicle 3 can reach the destination point with only the remaining electric power of the battery 32, the user can confirm the charging stations 2, which are on the way to the destination point, and the charging times at the respective charging stations 2. Thus the user can readily plan a travel schedule with sufficient time allowance.

The in-vehicle control unit 45 may be configured to check automatically whether the remaining electric power amount of the battery 32 at the departure point is less than the required total electric power for arrival at the destination point, when the turn-on of the ignition switch of the vehicle 3 is detected or the start of the motor of the vehicle 3 is detected. The in-vehicle control unit 45 thus operates as a vehicle drive condition detection section.

The in-vehicle control unit 45 may be configured to check automatically whether the remaining electric power amount of the battery 32 at the departure point is less than the required minimum electric power, when the turn-on of the ignition switch of the vehicle 3 is detected or the start of the motor of the vehicle 3 is detected. This is particularly advantageous in such a case that the battery 32 has discharged too much because the vehicle 3 has not been used for a long period.

The charging stations 2 are not limited to stations, which are managed by the charging management center 1. Other charging stations, which are not managed by the charging management center 1, may be included in the electric power amount information output system 100. With regard to availability information about such other charging stations, the in-vehicle control unit 45 may be configured to acquire information, which indicates that it is not clear whether such other charging stations are available, based on a fact that the availability information of such other charging stations are not acquired. In this case, the output unit 43 may be configured to display that the availability of the other charging stations, which are not managed by the charging management center 1, is not clear.

(Second Embodiment)

Figure 19:
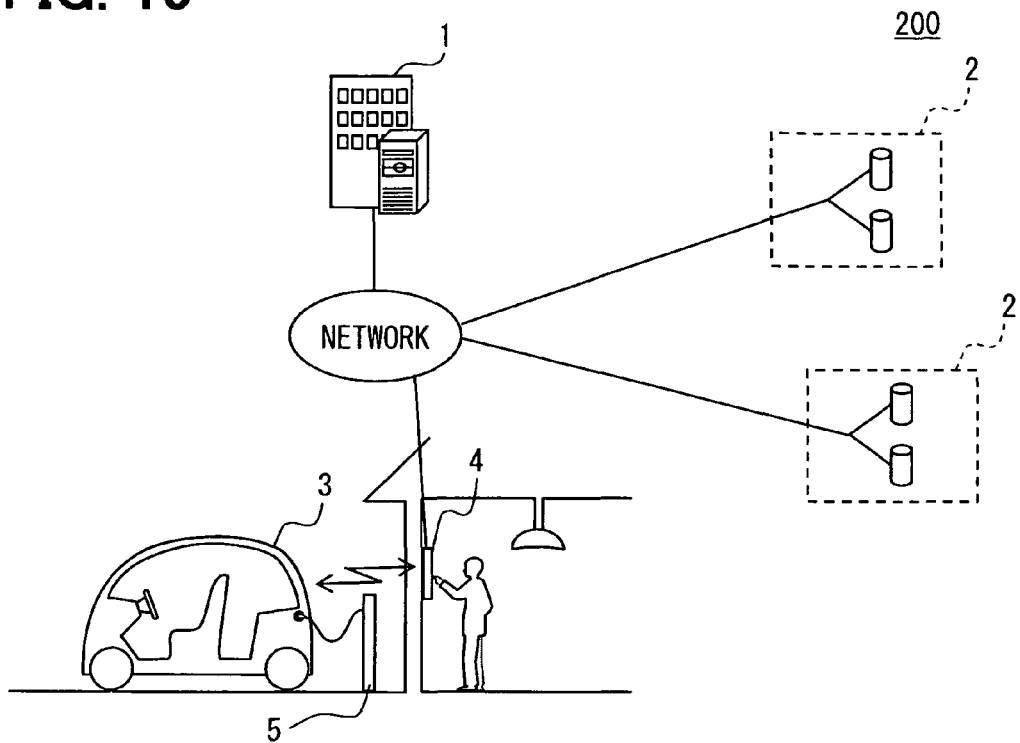
FIG. 19 is a block diagram schematically showing an electric storage information output system according to the second embodiment of the present invention.

The electric power output device 4 is not mounted in the vehicle 3, but is provided outside the vehicle 3. For example, it is provided at a building structure such as a house a facility, at which the vehicle 3 is parked, as shown in FIG. 19.

An electric power amount information output system 200 includes a charger device 5 in addition to the charging management center 1, the charging stations 2, the vehicle 3 and the electric power amount information output device 4. The charging management center 1, the charging stations 2 and the electric power amount information output device 4 are connected one another through a communications network such as the Internet network to be capable of transmitting and receiving information.

In the electric power amount information output system 200, the output device 4 is provided at a location, for example on a wall of the house, so that the user may readily operate it. Although the output device 4 may be provided outside or inside the building structure, it is preferably provided inside the building structure from the standpoint of security. The vehicle 3 includes therein a communications device, which transmits the remaining electric power amount information acquired by the charge control unit 33 to the in-vehicle communications unit 41 of the output device 4. The communications device provided in the vehicle 3 may be an in-vehicle communications module, which is used in telematics communications such as DCM, or other communications device, which connects to a communications network through cellular phones connected by way of Bluetooth. In addition, such a communications device may be a communications device, which communicates with the output device 4 by way of the short distance radio communications such as wireless LAN, Bluetooth or ZigBee or by way of PLC communications.

In the electric power amount information output system 200, the navigation information acquisition unit 44 may be configured to acquire information from the navigation device provided in the vehicle 3 through the communications device and the in-vehicle communications unit 41. The information, which the navigation information acquisition unit 44 acquires from the navigation device, includes the present position, the departure point, the destination point, the map data, the facilities, the guidance route, the travel candidate route and the like.

The charger device 5 is located within a premise, where the vehicle 3 is parked. The charger device 5 is configured to charge the battery 32 of the vehicle 3, when the remaining electric power amount of the battery 32 is less than the required minimum electric power amount calculated in the required minimum electric power amount calculation processing described above.

(Third Embodiment)

Figure 20:
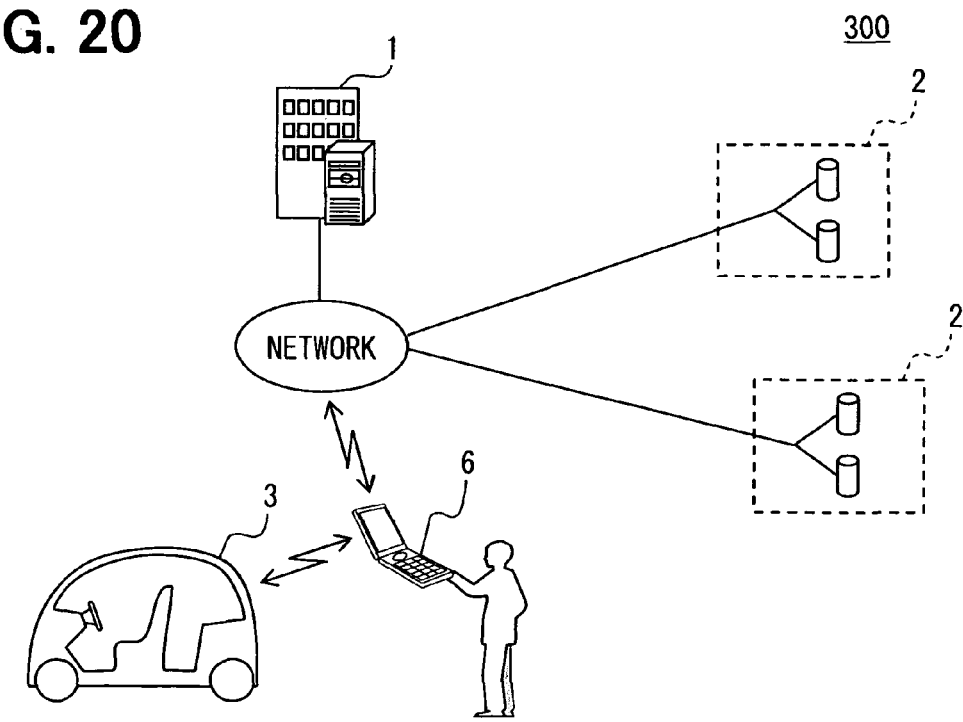
FIG. 20 is a block diagram schematically showing an electric storage information output system according to the third embodiment of the present invention

In the third embodiment, as shown in FIG. 20, the electric power amount information output device 4 is provided within a cellular phone 6 or the like, which is carried by the user. An electric power amount information output system 300 shown in FIG. 20 includes the cellular phone 6 in addition to the charging management center 1, the charging stations 2, the vehicle 3 and the electric power amount information output device 4. The charging management center 1, the charging stations 2 and the electric power amount information output device 4 are connected one another through the communications network such as the cellular phone network or the Internet network to be capable of transmitting and receiving information.

In the electric power amount information output system 300, the vehicle 3 includes therein a communications device, which transmits the remaining electric power amount information acquired by the charge control unit 33 to the in-vehicle communications unit 41 of the output device 4. The communications device provided in the vehicle 3 may be an in-vehicle communications module, which is used in telematics communications such as DCM.

In the electric power amount information output system 300, the navigation information acquisition unit 44 may be configured to acquire information from the navigation device provided in the vehicle 3 through the communications device and the in-vehicle communications unit 41. The information, which the navigation information acquisition unit 44 acquires from the navigation device, includes the present position, the departure point, the destination point, the map data, the facilities, the guidance route, the travel candidate route and the like.

The present invention is not limited to the disclosed embodiments but may be implemented in different embodiments.

What is claimed is:

1. An electric power amount information output device for outputting information indicating a remaining electric power amount of a battery provided as a drive power source to electrically drive a vehicle, the electric power amount information output device comprising:

a departure point information acquisition section, which acquires departure point information indicating a point of departure of the vehicle;

a destination point information acquisition section, which acquires destination point information indicating a point of destination of the vehicle;

a remaining electric power amount information acquisition section, which acquires remaining electric power amount information indicating an amount of electric power remaining in the battery;

a required total electric power amount calculation section, which calculates a required total electric power amount based on the departure point information and the destination point information, the required total electric power amount indicating an amount of electric power required for the vehicle to travel from the departure point to the destination point;

an output section, which outputs information; and a control section, which checks whether the remaining electric power amount indicated by the remaining electric power amount information at the departure point is less than the required total electric power amount, and drives the output section to output insufficiency information indicating that the remaining electric power amount of the battery is insufficient if the remaining electric power amount is less than the required total electric power amount, wherein the electric power amount information output device further comprises an availability information acquisition section, which acquires availability information indicating availability of each of a plurality of charging stations provided to charge batteries, the control section further drives the output section to output the availability information of each of the charging stations, if the remaining electric power amount is less than the required total electric power amount, the electric power amount information output device further comprises a location information acquisition section, which acquires location information indicating a location of each of the charging stations, the control section searches for a reachable charging station, which the vehicle is able to reach with the remaining electric power amount, based on the departure point information, the location information and the remaining electric power amount information, and limits the availability information to only the reachable charging station, the electric power amount information output device further comprises a required supplemental electric power amount calculation section, which calculates a required supplemental electric power amount required to be charged to the battery at the reachable charging station for the vehicle to travel from the reachable charging station to the destination point with respect to each of the reachable charging stations, the required total electric power amount is calculated based on the location information of the reachable charging station in addition to the departure point information and the destination point information, so that the required total electric power amount indicates a total amount of electric power required for the vehicle to travel from the departure point to the destination point through the reachable charging station, the electric power amount information output device further comprises a charging start time calculation section, which calculates a charging start time based on the availability information of the charging station and the required supplemental electric power amount with respect to each reachable charging station the charging start time indicating a start time of charging allowed to charge the required supplemental electric power at the reachable charging station, the control section drives the output section to output the charging start time at the reachable charging station as the display information with respect to each charging station in an order of earlier time of the charging start time, the electric power amount information output device further comprises a priority selection input reception section, which receives an input of priority selection of one of at least two display information outputted by the output section, the control section drives the output section to output the display information in an order of the priority selected by the priority selection input reception section, wherein the electric power amount information output device further comprises a temporary reservation request signal transmission section, which transmits a request signal of a temporary reservation for the charging station, the temporary reservation being effective only for a predetermined period, and the control section drives the temporary reservation request signal transmission section to transmit the request signal to the charging station, which is outputted at a top of a list of charging stations rearranged in accordance with the selected priority.

2. The electric power amount information output device according to claim 1, wherein:

the availability information includes information about at least one of whether and when the charging station is available for battery charging.

3. The electric power amount information output device according to claim 1, wherein:

the control section calculates a required minimum electric power amount based on the departure point information and the location information, the required minimum electric power amount indicating a minimum amount of electric power required for the vehicle to travel from the departure point to each of the charging stations; and the control section searches for the reachable charging station based on the required minimum electric power amount and the remaining electric power amount.

4. The electric power amount information output device according to claim 3, further comprising:

a route information acquisition section, which acquires route information indicating travel routes the vehicle is able to take from the departure point to the destination point, wherein the control section limits the reachable charging station to only charging stations, which are located on the travel routes indicated by the route information.

5. The electric power amount information output device according to claim 1, further comprising:

a departure time information acquisition section, which acquires a departure time information indicating a scheduled time of departure of the vehicle from the departure point; and an estimated station-arrival time calculation section, which calculates an estimated station-arrival time indicating an estimated time of arrival at the reachable charging station, based on the departure point information, the location information of the reachable charging station and the departure time information, wherein the control section drives the output section to output the reachable charging station as display information in an order of earlier time of the estimated station-arrival time.

6. The electric power amount information output device according to claim 5, wherein:

the control section drives the output section to output the availability information about each charging station, at which the vehicle is able to reach after the estimated station-arrival time.

7. The electric power amount information output device according to claim 1, wherein:

an estimated destination-arrival time calculation section, which calculates an estimated destination-arrival time based on the availability information of the charging station, the required supplemental electric power amount, the destination point information and the location information of the reachable charging station, the estimated destination-arrival time indicating an estimated time of arrival at the destination point when the battery is charged at the reachable charging station;

the control section drives the output section to output the estimated destination-arrival time as the display information with respect to each charging station in an order of earlier time of the estimated destination-arrival time.

8. The electric power amount information output device according to claim 1, further comprising:

an electric power consumption amount calculation section, which calculates a total electric power consumption amount based on the departure point information, the location information of the charging stations and the destination point information, the total electric power consumption amount indicating a total amount of electric power consumed by the vehicle in traveling from the departure point to the destination point by way of the charging station, wherein the control section drives the output section to output the total electric power consumption amount as the display information with respect to each charging station in an order of least total electric power consumption amount.

9. The electric power amount information output device according to claim 1, further comprising:

a disturbance information acquisition section, which acquires disturbance information indicating disturbances that affects an electric power consumption amount of the battery, wherein the control section corrects a required total electric power amount in accordance with the disturbance information.

10. The electric power amount information output device according to claim 1, further comprising:

a charging station selection input reception section, which receives an input of selection of the reachable charging station among the charging stations; and a formal reservation request signal transmission section, which transmits a formal reservation request signal indicating a formal request to the reachable charging station selected and received by the charging station selection input reception section.

11. The electric power amount information output device according to claim 1, further comprising:

a nearest location information acquisition section, which acquires a nearest location information indicating a nearest charging station among a plurality of charging stations provided for charging batteries, the nearest charging station being closest to the departure point;

a required minimum power amount calculation section, which calculates a required minimum power amount based on the departure point information and the nearest location information, the required minimum power amount indicating a minimum amount of electric power of the battery required for the vehicle to travel from the departure point to the nearest charging station, wherein the control section checks whether the remaining electric power amount is less than the required minimum power amount, in case that the remaining electric power amount is less than the required total power amount, and wherein the control section drives the output section to output charge request information indicating that the battery is requested to be charged before starting to travel from the departure point, if the remaining electric power amount is less than the required minimum electric power amount.

12. An electric power amount information output system comprising:

the electric power amount information output device according to claim 1; and a communications device, which is provided in the vehicle to communicate with the electric power amount information output device, wherein the communications device transmits the remaining electric power amount information of the battery at the departure point to the electric power amount information output device, and wherein the electric power amount information output device is provided in a building structure outside the vehicle.

13. An electric power amount information output system comprising:

the electric power amount information output device according to claim 1; and a communications device, which is provided in the vehicle to communicate with the electric power amount information output device, wherein the communications device transmits the remaining electric power amount information of the battery at the departure point to the electric power amount information output device, and wherein the electric power amount information output device is provided in a cellular phone carried by a user.

14. An electric power amount information output system comprising:

the electric power amount information output device according to claim 1, wherein the electric power amount information output device is provided in the vehicle.

15. The electric power amount information output system according to claim 14, wherein:

the electric power amount information output device further comprises a vehicle drive condition detection section, which detects whether electric drive of the vehicle is started; and when the electric drive of the vehicle is detected, the control section checks whether the remaining electric power amount at the departure point is less than the required total electric power amount, and drives the output section to output insufficiency information indicating that the remaining electric power amount of the battery is insufficient if the remaining electric power amount is less than the required total electric power amount.

16. The electric power amount information output system according to claim 14, wherein:

the electric power amount information output device includes the nearest location information acquisition section, the required minimum electric power amount calculation section and a vehicle drive condition detection section, which detects whether electric drive of the vehicle is started; and when the electric drive of the vehicle is detected, the control section checks whether the remaining electric power amount is less than the required minimum power amount, and drives the output section to output, charge request information indicating that the battery is requested to be charged before starting to travel from the departure point, if the remaining electric power amount is less than the required minimum electric power amount.

\* \* \* \* \*